(12) United States Patent
Cheng et al.

(10) Patent No.: US 9,884,758 B2
(45) Date of Patent: Feb. 6, 2018

(54) SELECTIVE NITRIDE OUTGASSING PROCESS FOR MEMS CAVITY PRESSURE CONTROL

(71) Applicant: Taiwan Semiconductor Manufacturing Co., Ltd., Hsin-Chu (TW)

(72) Inventors: Shyh-Wei Cheng, Zhudong Township (TW); Hsi-Cheng Hsu, Taichung (TW); Hsin-Yu Chen, Hsinchu (TW); Ji-Hong Chiang, Changhua (TW); Jui-Chun Weng, Taipei (TW); Wei-Ding Wu, Zhubei (TW); Yu-Jui Wu, Hsin-Chu (TW); Ching-Hsiang Hu, Taipei (TW); Ming-Tsung Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/182,754

(22) Filed: Jun. 15, 2016

(65) Prior Publication Data

US 2017/0203962 A1    Jul. 20, 2017

Related U.S. Application Data

(60) Provisional application No. 62/279,230, filed on Jan. 15, 2016.

(51) Int. Cl.
*H01L 21/00* (2006.01)
*B81C 1/00* (2006.01)
*B81B 7/00* (2006.01)

(52) U.S. Cl.
CPC ........ *B81C 1/00285* (2013.01); *B81B 7/0038* (2013.01); *B81B 2207/012* (2013.01);
(Continued)

(58) Field of Classification Search
CPC combination set(s) only.
See application file for complete search history.

(56) References Cited

U.S. PATENT DOCUMENTS 8,987,059 B2  3/2015  Liang et al.
9,040,334 B2  5/2015  Chu et al.
(Continued)

OTHER PUBLICATIONS

U.S. Appl. No. 15/193,410, filed Jun. 27, 2016.
(Continued)

*Primary Examiner* — Telly Green
(74) *Attorney, Agent, or Firm* — Eschweiler & Potashnik, LLC

(57) ABSTRACT

The present disclosure relates to a MEMS package having an outgassing element configured to adjust a pressure within a hermetically sealed cavity by inducing outgassing of into the cavity, and an associated method. In some embodiments, the method is performed by forming an outgassing element within a passivation layer over a CMOS substrate and forming an outgassing resistive layer to cover the outgassing element. The outgassing resistive layer is removed from over the outgassing element, and the MEMS substrate is bonded to a front side of the CMOS substrate to enclose a first MEMS device within a first cavity and a second MEMS device within a second cavity. After removing the outgassing resistive layer, the outgassing element releases a gas into the second cavity to increase a second pressure of the second cavity to be greater than a first pressure of the first cavity.

20 Claims, 4 Drawing Sheets

(52) U.S. Cl.
CPC ... *B81B 2207/07* (2013.01); *B81C 2203/0118* (2013.01); *B81C 2203/0792* (2013.01)

(56) References Cited

U.S. PATENT DOCUMENTS

| | | | |
|---|---|---|---|
| 9,065,358 B2 | 6/2015 | Tsai et al. | |
| 9,085,455 B2 | 7/2015 | Cheng et al. | |
| 9,085,456 B2 | 7/2015 | Tsai et al. | |
| 9,122,827 B2 | 9/2015 | Chen et al. | |
| 9,133,017 B2 | 9/2015 | Liang et al. | |
| 9,138,994 B2 | 9/2015 | Peng et al. | |
| 9,139,420 B2 | 9/2015 | Chang et al. | |
| 9,139,423 B2 | 9/2015 | Chien et al. | |
| 9,181,083 B2 | 11/2015 | Tsai et al. | |
| 9,187,317 B2 | 11/2015 | Cheng et al. | |
| 9,233,839 B2 | 1/2016 | Liu et al. | |
| 9,236,877 B2 | 1/2016 | Peng et al. | |
| 9,238,581 B2 | 1/2016 | Wu et al. | |
| 9,452,925 B2 * | 9/2016 | Zhang | B81C 1/00246 |
| 2004/0077117 A1 * | 4/2004 | Ding | B81B 7/007 438/51 |
| 2005/0095814 A1 | 5/2005 | Zhu | |
| 2009/0294879 A1 * | 12/2009 | Bhagavat | B81C 1/00269 257/415 |
| 2010/0025845 A1 * | 2/2010 | Merz | B81B 7/0038 257/723 |
| 2011/0079425 A1 * | 4/2011 | Baillin | B81C 1/00285 174/521 |
| 2011/0108933 A1 | 5/2011 | Nakatani | |
| 2011/0121412 A1 * | 5/2011 | Quevy | B81B 7/02 257/415 |
| 2012/0043627 A1 * | 2/2012 | Lin | B81B 7/02 257/415 |
| 2012/0142144 A1 | 6/2012 | Taheri | |
| 2012/0326248 A1 * | 12/2012 | Daneman | B81B 7/02 257/415 |
| 2013/0168740 A1 | 7/2013 | Chen | |
| 2013/0277777 A1 | 10/2013 | Chang | |
| 2013/0334621 A1 | 12/2013 | Classen | |
| 2014/0042562 A1 | 2/2014 | Chu | |
| 2014/0225206 A1 * | 8/2014 | Lin | B81B 7/0038 257/417 |
| 2014/0239353 A1 | 8/2014 | Daneman | |
| 2014/0264644 A1 | 9/2014 | Wu | |
| 2014/0270272 A1 | 9/2014 | Peng | |
| 2014/0287548 A1 | 9/2014 | Lin et al. | |
| 2015/0008540 A1 | 1/2015 | Chu | |
| 2015/0129991 A1 * | 5/2015 | Lee | B81B 7/02 257/415 |
| 2015/0137303 A1 | 5/2015 | Chou et al. | |
| 2015/0158720 A1 | 6/2015 | Lim | |
| 2015/0175405 A1 | 6/2015 | Cheng | |
| 2015/0175407 A1 | 6/2015 | Cheng et al. | |
| 2015/0196912 A1 | 7/2015 | Tsai et al. | |
| 2015/0360939 A1 * | 12/2015 | Zhang | B81C 1/00246 438/51 |
| 2016/0146705 A1 | 5/2016 | Berkcan | |
| 2017/0001861 A1 * | 1/2017 | Zhang | B81C 1/00246 |
| 2017/0005100 A1 | 1/2017 | Cho | |
| 2017/0057813 A1 | 3/2017 | Shin | |

OTHER PUBLICATIONS

U.S. Appl. No. 15/215,753, filed Jul. 21, 2016.
Non-Final Office Action dated May 25, 2017 in connection with U.S. Appl. No. 15/193,410.
Non-Final Office Action dated Sep. 21, 2017 in connection with U.S. Appl. No. 15/215,753.
Final Office Action dated Nov. 9, 2017 in connection with U.S. Appl. No. 15/193,410.

* cited by examiner

SELECTIVE NITRIDE OUTGASSING PROCESS FOR MEMS CAVITY PRESSURE CONTROL

REFERENCE TO RELATED APPLICATION

This Application claims priority to U.S. Provisional Application No. 62/279,230 filed on Jan. 15, 2016, the contents of which is hereby incorporated by reference in its entirety.

BACKGROUND

In the past decade, micro-electromechanical system (MEMS) devices have become increasingly common in electronic devices (e.g., cell phones, sensors, etc.). MEMS devices include mechanical and electrical features that are able to that sense physical forces or quantities (e.g., acceleration, radiation, etc.) and/or control physical quantities (e.g., fluids). Examples of MEMS devices include microsensors, which convert mechanical signals into electrical signals, and micro-actuators, which convert electrical signals into mechanical signals.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
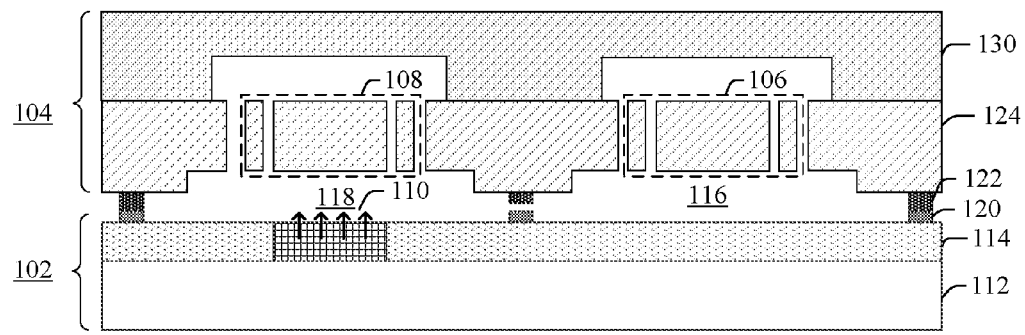
FIG. 1 illustrates a cross-sectional view of some embodiments of a micro-electromechanical system (MEMS) package having an outgassing element configured to adjust a pressure of a hermetically sealed cavity.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

MEMS devices often operate in a manner that is dependent on an environment surrounding the device. To improve operation of a MEMS device, the MEMS device is operated within a surrounding environment that has a specific pressure that enables improved measurement. For example, in the case of a MEMS vibrational gyroscope, a surrounding environment having a relative lower pressure (i.e., a higher vacuum) provides for a better measurement since it enhances displacement of a proof mass, which is converted to a signal. Conversely, a MEMS accelerometer using a relative higher pressure mitigates displacement of a proof mass due to background disturbance that is converted to noise.

Therefore, MEMS devices are set within hermetically sealed cavities that are held at a controlled pressure level. When there is one type of MEMS device on a wafer, a wafer level capping process can be used to form hermetically sealed cavities held at a desired pressure. However, when there are a plurality of different types of MEMS devices on the same wafer, forming hermetically sealed cavities at different pressures using one wafer level capping process becomes challenging, since such a capping process forms cavities at a pressure of an ambient pressure where the cavities are formed. One approach to integrate MEMS devices of different pressures is performing an extra package process and forming cavities of different pressures separately. However, the use of extra package process increases production cost by increasing processing time and a number of processing steps. Also, the size of the device may increase as extra wire bonds may be needed.

The present disclosure relates to a micro-electromechanical system (MEMS) package that comprises an outgassing element configured to adjust a pressure within a hermetically sealed cavity by inducing outgassing into the cavity, and an associated method. In some embodiments, the MEMS package comprises a CMOS substrate having a passivation layer disposed over a semiconductor substrate. A MEMS substrate is bonded to the CMOS substrate, enclosing a first MEMS device hermetically sealed within a first cavity having a first pressure and a second MEMS device hermetically sealed within a second cavity having a second pressure. An outgassing element is disposed within the passivation layer and is exposed to the second cavity. The outgassing element is configured to release a gas into the second cavity to increase the second pressure of the second cavity. By having the outgassing element release the gas, the second pressure of the second cavity can be adjusted after it is formed to be greater than the first pressure of the first cavity, thereby enabling the formation of hermetically sealed cavities having different pressures within the same substrate.

FIG. 1 illustrates a cross-sectional view of some embodiments of a micro-electromechanical system (MEMS) package 100 having an outgassing element configured to adjust a pressure of a hermetically sealed cavity. The MEMS package 100 comprises a CMOS substrate 102 including a passivation layer 114 disposed over a substrate 112. An outgassing element 110 is disposed within the passivation layer 114.

A MEMS substrate 104 is bonded to the CMOS substrate 102, enclosing a first MEMS device 106 within a first cavity 116 and a second MEMS device 108 within a second cavity 118. In some embodiments, the first MEMS device 106 and the second MEMS device 108 are incorporated within a MEMS layer 124 (e.g., a doped layer of semiconductor material). The MEMS layer 124 may be bonded to the passivation layer 114 from a front side through a first bonding metal layer 120 and a second bonding metal layer 122. In some embodiments, a capping substrate 130 is attached to a back side of the MEMS layer 124, to hermitically seal the first cavity 116 and the second cavity 118. The first cavity 116 is hermetically sealed to have a first pressure, and the second cavity 118 is hermetically sealed to have a second pressure. In some embodiments, the outgassing element 110 is exposed to the second cavity 118, and configured to release a gas into the second cavity 118 during a high temperature thermal process (e.g., during a process having a temperature greater than or equal to approximately 200° C.) to increase the second pressure of the second cavity 118. For example, the outgassing element 110 may be configured to release a gas into the second cavity 118 during or after a bonding process between the CMOS substrate 102 and the MEMS substrate 104, thereby resulting the second pressure greater than the first pressure.

Figure 2:
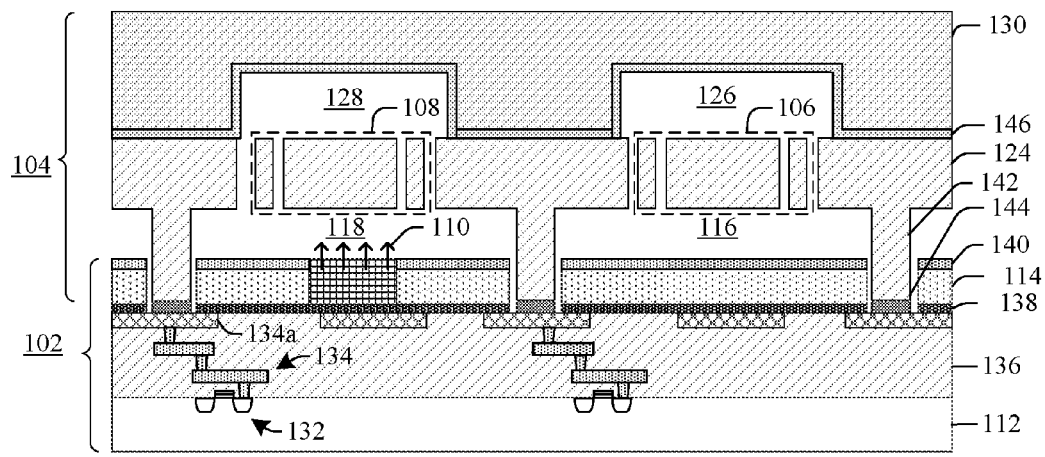
FIG. 2 illustrates a cross-sectional view of some alternative embodiments of a micro-electromechanical system (MEMS) package having an outgassing element configured to adjust a pressure of a hermetically sealed cavity.

FIG. 2 illustrates a cross-sectional view of some additional embodiments of a micro-electromechanical system (MEMS) package 200 having an outgassing element configured to adjust a pressure of a hermetically sealed cavity. The MEMS package 200 comprises a CMOS substrate 102 and a MEMS substrate 104. The MEMS substrate 104 is bonded to the CMOS substrate 102, enclosing a first MEMS device 106 within a first cavity 116 and a second MEMS device 108 within a second cavity 118.

An outgassing element 110 is disposed in the second cavity 118, and is configured to release a gas into the second cavity 118 to increase a second pressure of the second cavity 118, such that the second pressure is greater than a first pressure of the first cavity 116. In some embodiments, the first cavity 116 is hermetically sealed and filled with a first gas at a first gas pressure; while the second cavity 118 is hermetically sealed and filled with a second gas at a second gas pressure. The outgas sing element 110 is configured to release a gas into the second cavity 118 to increase the second pressure of the second cavity 118, to provide for the second pressure being greater than the first pressure. By independently controlling the pressures within the first and second cavities 116, 118, performance of the MEMS package 200 can be improved. For example, performance of a motion sensor having the first MEMS device 106 including an accelerometer, and the second MEMS device 108 including a gyroscope can be increased by independently controlling the pressures within the first and second cavities 116, 118, which optimizes function of the first and second MEMS devices 106, 108 (i.e., the accelerometer and the gyroscope).

The CMOS substrate 102 comprises a plurality of semiconductor devices 132 (e.g., transistors, capacitors, resistors, inductors, diodes, etc.) arranged within a substrate 112. In some embodiments, the CMOS substrate 102 may comprise complementary metal-oxide semiconductor (CMOS) devices that are configured to provide such functions as analog-to-digital conversion, amplification, storage, filtering, etc. In some embodiments, the substrate 112 can be a bulk semiconductor wafer such as a silicon wafer that is lightly doped. The substrate 112 can also be implemented as a binary compound substrate (e.g., GaAs wafer), a ternary compound substrate (e.g., AlGaAs), or higher order compound wafers, among others. Further, the substrate 112 can also include non-semiconductor materials such as oxide in silicon-on-insulator (SOI), partial SOI substrate, polysilicon, amorphous silicon, or organic materials, among others. In some embodiments, the substrate 112 can include multiple wafers or dies which are stacked or otherwise adhered together.

A plurality of metal interconnect layers 134 including metal wire layers and vias are disposed within a dielectric structure 136 over the substrate 112. The plurality of metal interconnect layers 134 may comprise a conductive metal material such as copper, aluminum, tungsten, etc. The dielectric structure 136 may comprise a plurality of inter-level dielectric (ILD) layers comprising one or more of a low-k dielectric layer, an ultra-low-k dielectric layer, an extreme low-k dielectric layer, and/or a silicon dioxide layer.

A passivation layer 114 is disposed over the plurality of metal interconnect layers 134 and the dielectric structure 136. The passivation layer is configured to protect underlying layers from damage during formation of the MEMS package 200. In some embodiments, the passivation layer 114 comprises high density plasma dielectric layers, for example a high density plasma oxide layer. The outgassing element 110 is disposed within a trench in the passivation layer 114, and has an upper surface that is exposed to the second cavity 118. In some embodiments, the outgassing element 110 comprises the same material with the passivation layer 114, such as a high density plasma oxide layer. In other embodiments, the outgas sing element 110 may comprise a different material than the passivation layer 114.

In some embodiments, a hard mask layer 140 is formed over the passivation layer 114. The hard mask layer 140 is configured to help patterning of the passivation layer 114. The upper surface of the outgassing element 110 may be coplanar with that of the hard mask layer 140. In some embodiments, a conductive layer 138, for example a titanium nitride layer, is disposed between the passivation layer 114 and the plurality of metal interconnect layers 134 and/or the ILD layer 136. The conductive layer 138 is configured to act as a charge balancing layer for the CMOS substrate 102.

In some embodiments, the MEMS substrate 104 comprises a MEMS layer 124 having a front side facing the CMOS substrate 104, and a capping substrate 130 attached to a back side of the MEMS layer 124 opposite to the front side. In some embodiments, the capping substrate 130 is bonded to the MEMS layer 124 through a eutectic bond, such as a semiconductor-to-metal bonding or a metal-to-metal bonding. In some embodiments, the capping substrate 130 comprises a first recess 126 and a second recess 128 arranged within a front side of the capping substrate 130 facing the MEMs substrate. The first recess 126 and the second recess are configured to be parts of the first cavity 116 and the second cavity, respectively. In some embodiments, a dielectric liner 146 may be conformally disposed along the front surface of the capping substrate 130, including surfaces of the first and second recesses 126, 128. In some embodiments, the capping substrate 130 may be bonded to the MEMS layer 124 through the dielectric liner 146.

In some embodiments, the CMOS substrate 102 and the MEMS substrate 104 are bonded through a top metal layer 134a of the plurality of metal interconnect layers 134 and a conductive bonding pad 144 of the MEMS substrate 104.

The top metal layer 134a is disposed between the passivation layer 114. The conductive bonding pad 144 may extend through the hard mask layer 140 and the passivation layer 114 to contact the top metal layer 134a at a bonding interface. In some embodiments, the conductive bonding pad 144 is disposed on protrusion 142 extending outward from the MEMS layer 124. In other embodiments, the conductive bonding pad 144 may be disposed conformally along sidewall and bottom surfaces of the protrusion 142.

FIGS. 3-9 illustrate some embodiments of cross-sectional views 300-900 showing a method of forming a microelectromechanical system (MEMS) package having an outgassing element configured to adjust a pressure within a hermetically sealed cavity.

Figure 3:
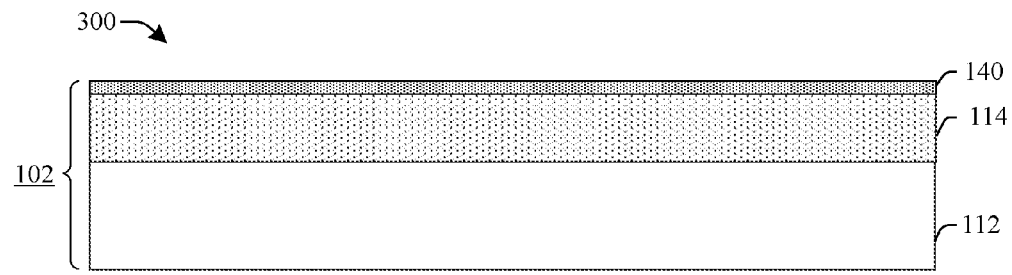
FIGS. 3-10 illustrate some embodiments of cross-sectional views showing a method of forming a MEMS package having an outgassing element configured to adjust a pressure of a hermetically sealed cavity.

As shown in cross-sectional view 300 of FIG. 3, a substrate 112 is provided. In various embodiments, the substrate 112 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, a plurality of semiconductor devices and a plurality of metal interconnect layers (arranged within a dielectric structure comprising one or more inter-level dielectric (ILD) layers) can be formed over the substrate 112 to form a CMOS substrate 102. The plurality of metal interconnect layers may be formed by forming trench and via openings within an ILD layer, which is selectively exposed to an etchant (e.g., $CF_4$, $CHF_3$, $C_4F_8$, HF, etc.) that etches the ILD layer, followed by filling a conductive metal material such as copper, aluminum, tungsten, etc. into the trench and via openings. In some embodiments, a chemical mechanical polishing (CMP) process may be used to remove excess of the metal material from an upper surface of the ILD layer.

A passivation layer 114 is formed over the substrate 112. The passivation layer 114 may be formed by way of a deposition process (e.g., chemical vapor deposition (CVD), physical vapor deposition (PVD), atomic layer deposition (ALD), etc.). In some embodiments, the passivation layer 114 may be formed by way of a plasma enhanced chemical vapor deposition (PECVD) process. In some embodiments, a hard mask layer 140 is formed over the passivation layer 114. The hard mask layer 140 may be formed by way of a deposition process and then be patterned by a photoresist mask using a lithography process.

Figure 4:
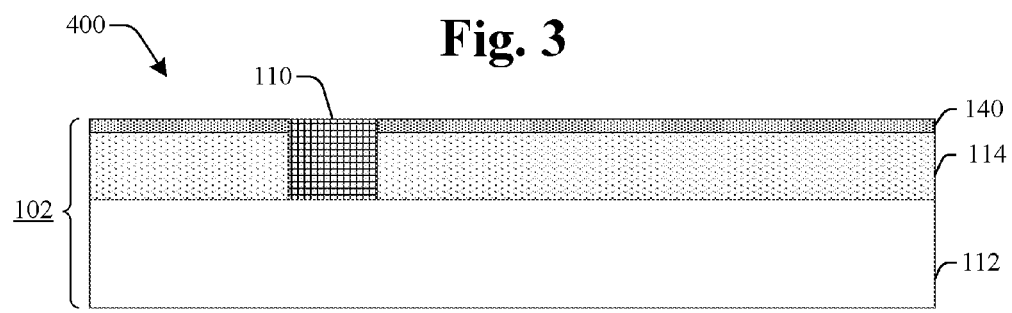

As shown in cross-sectional view 400 of FIG. 4, the hard mask layer 140 and the passivation layer 114 are patterned to form a trench at a position where a MEMS device cavity would overly in a later stage of manufacturing. The trench is subsequently filled by an outgassing element 110. In some embodiments, the outgassing element 110 is formed by depositing an outgassing layer (an oxide layer for example) by a plasma enhanced chemical vapor deposition (PECVD) process over the passivation layer 114. The outgassing layer is then removed from an upper surface of the hard mask layer 140 and is kept within the trench of the passivation layer 114. In some embodiments, the outgassing element 110 has an upper surface coplanar with that of the hard mask layer 140.

Figure 5:
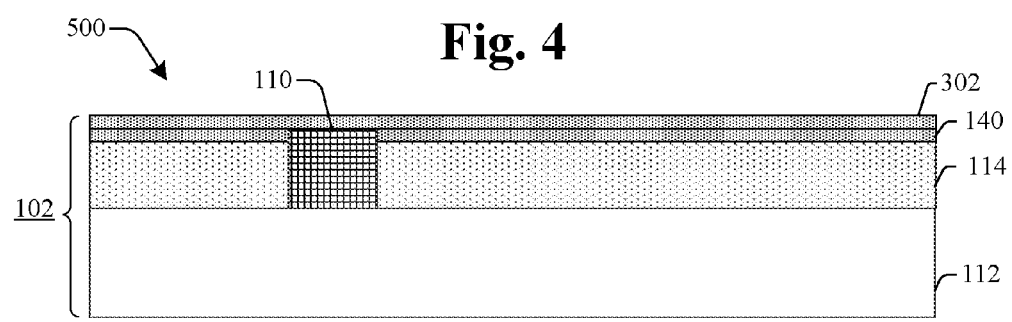

As shown in cross-sectional view 500 of FIG. 5, an outgassing resistive layer 302 is formed over the outgassing element 110 and the hard mask layer 140. In some embodiments, the outgassing resistive layer 302 may be formed by way of a deposition process (e.g., chemical vapor deposition (CVD), physical vapor deposition (PVD), atomic layer deposition (ALD), etc.). The outgassing resistive layer 302 may comprise silicon nitride. The outgassing resistive layer 302 covers the outgassing element 110 and prevents outgassing from the outgassing element 110. In some embodiments, the outgassing element 110 comprises the same material of the passivation layer 114. However, unlike the passivation layer 114, which is exposed during some thermal processes, the outgassing element 110 is covered by the outgassing resistive layer 302 after formation, such that an outgassing process can be more efficiently performed during or after a bonding process by the outgassing element 110 in order to tune a cavity pressure.

Figure 6:
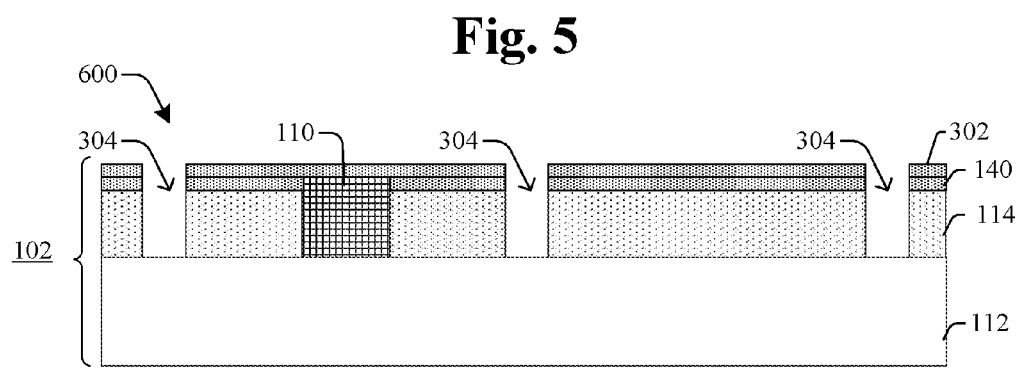

As shown in cross-sectional view 600 of FIG. 6, a second patterning process is performed to the outgassing resistive layer 302, the hard mask layer 140, and the passivation layer 114 to form a plurality of bonding trenches that provide for an electrical connection between devices within the substrate 112 and a MEMs substrate (subsequently formed in FIG. 9). The second patterning process may comprise an etching process, which may include a dry etching process (e.g., using a plasma etchant, a RIE etchant, etc.) or a wet etching process (e.g., using hydrofluoric acid (HF)). In some embodiments, the plurality of bonding trenches 304 are formed through the passivation layer 114 by the etching process. In other embodiments, a previously formed metal layer is exposed by forming the bonding trenches 304. Additional preparation processes, such as planarization or cleaning processes may be performed to the metal layer for a subsequent bonding process.

Figure 7:
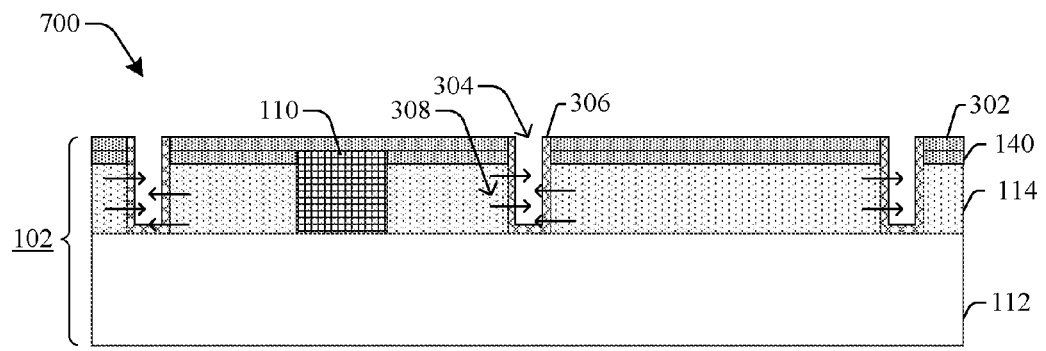

As shown in cross-sectional view 700 of FIG. 7, a first bonding pad 306 is formed over the CMOS substrate 102. In some embodiments, the first bonding pad 306 is formed conformally along surfaces of the bonding trenches 304. In some other embodiments, the first bonding pad 306 may be formed over the outgassing resistive layer 302. The first bonding pad 306 may be formed by way of a deposition process (e.g., chemical vapor deposition (CVD), physical vapor deposition (PVD), atomic layer deposition (ALD), etc.) during which a thermal process may be involved. In some embodiments, the passivation layer 114 may release a gas 308 during the thermal process, while the outgassing element 110 is protected by the outgassing resistive layer 302.

Figure 8:
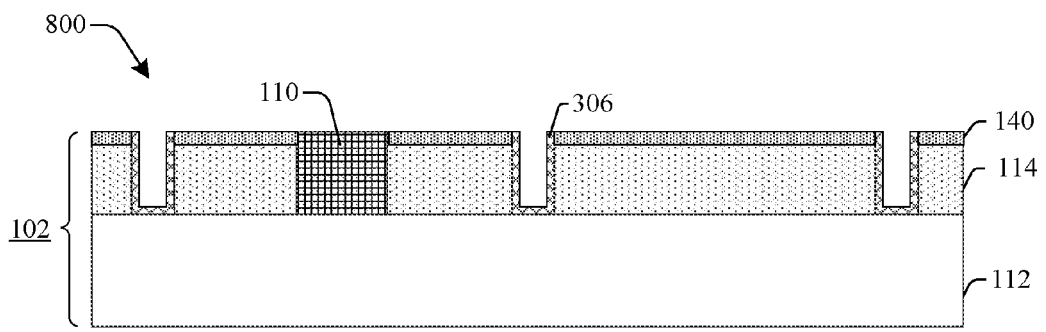

As shown in cross-sectional view 800 of FIG. 8, the outgassing resistive layer 302 is removed to expose the outgassing element 110. In some embodiments, the outgassing resistive layer 302 is etched by a dry etching process (e.g., using a plasma etchant, a RIE etchant, etc.) followed by a wet cleaning process.

Figure 9:
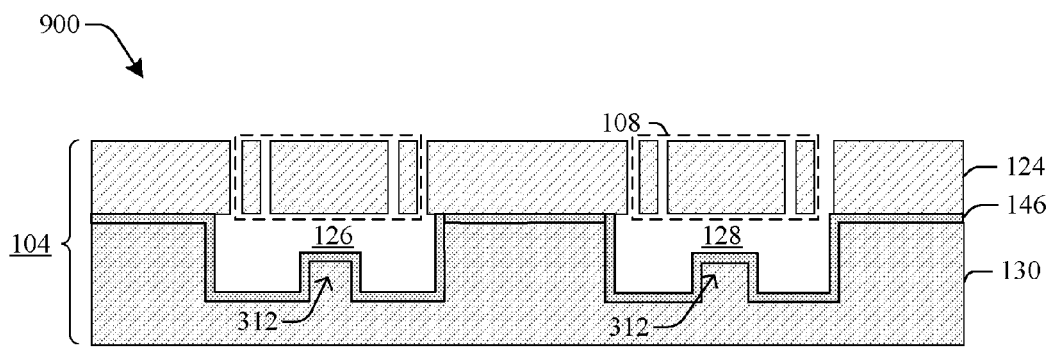

As shown in cross-sectional view 900 of FIG. 9, a MEMS substrate 104 is prepared. In some embodiments, the MEMS substrate 104 is prepared by having a capping substrate 130 selectively etched to form a first recess 126 and a second recess 128 within a front-side of the capping substrate 130. In some embodiments, the capping substrate 130 further includes anti-stiction bumps 312 protruding from a lateral surface the first recess 126 and the second recess 128. The anti-stiction bumps 312 are configured to reduce stiction between the capping substrate 130 and MEME devices within the first and second cavities, 126 and 128. A dielectric liner 146 can be formed along the front side of the capping substrate 130. In some embodiments, the dielectric liner 146 comprises an oxide (e.g., $SiO_2$) formed by way of a thermal process. In other embodiments, the dielectric liner 146 comprises an oxide (e.g., $SiO_2$) formed by way of a deposition process (e.g., chemical vapor deposition (CVD), physical vapor deposition (PVD), atomic layer deposition (ALD), etc.). In some embodiments, the dielectric liner 146 may extend along surfaces of the first recess 126 and the second recess 128.

A MEMS layer 124 (e.g., a MEMs substrate) can be bonded to or formed over the dielectric liner 146 to form one or more cavities between the capping substrate 130 and the MEMS layer 124. In some embodiments, the MEMS layer 124 may be bonded to the dielectric liner 146 through a fusion bonding process. In some embodiments, the MEMS layer 124 is patterned to form a first MEMS device 106 and a second MEMS device 108. A bonding structure 314 is formed onto the MEMS substrate 104, for example, on an upper surface of the MEMS layer 124. In various embodiments, the bonding structure 314 may be formed by way of a deposition process (e.g., chemical vapor deposition (CVD), physical vapor deposition (PVD), atomic layer deposition (ALD), etc.).

Figure 10:
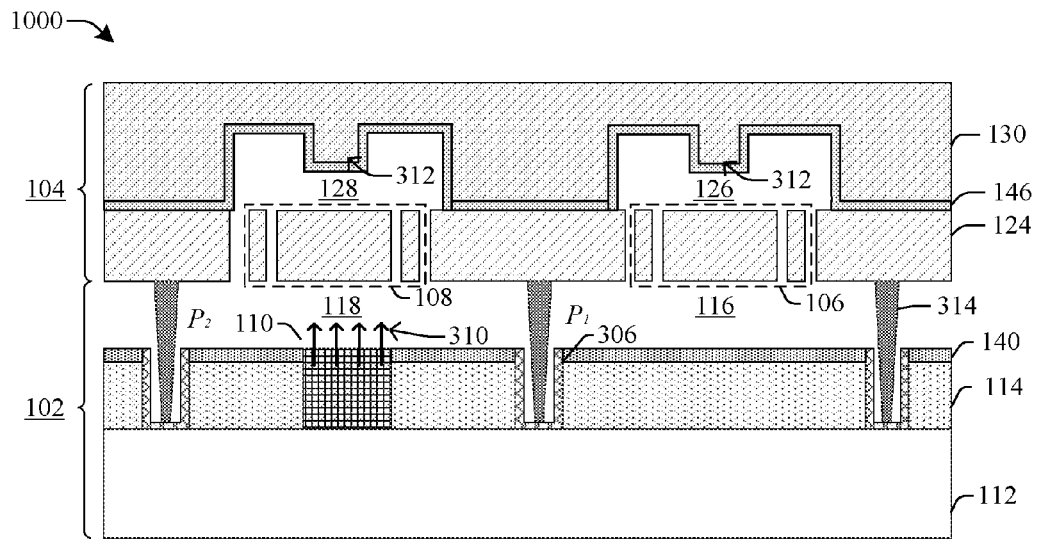

As shown in cross-sectional view 1000 of FIG. 10, a MEMS substrate 104 is bonded to the CMOS substrate 102. The MEMs substrate 104 may be bonded to the CMOS substrate 102 by way of a high temperature bonding process. The high temperature bonding process causes the outgassing element 110 to release a gas into the second cavity 118 to change a pressure P2 within the second cavity.

For example, in some embodiments, the MEMS layer 124 is bonded to the CMOS substrate through a eutectic bonding between the bonding pad 306 and the bonding structure 314. In some embodiments, the eutectic bond includes a semiconductor-to-metal bonding between a semiconductor material and a metal material. In some embodiments, the semiconductor material includes at least one of Ge, Si, SiGe or another semiconductor material. In some embodiments, the metal material includes at least one of Al, Cu, Ti, Ta, Au, Ni, Sn, or another metal. Another example of the eutectic bonding is a metal-to-metal bonding between two metal materials each including at least one of Al, Cu, Ti, Ta, Au, Ni, Sn, or another metal. The materials to be bonded are pressed against each other in an annealing process to form a eutectic phase of the materials. For example, a eutectic binding between Ge and Al is formed at an annealing temperature in a range from 400° C. to 450° C.

The bonding process is performed at a first ambient pressure $P_1$ (e.g., a pressure of a processing chamber in which the bonding occurs) which causes the MEMS substrate 104 and the CMOS substrate 102 to enclose a first hermetically sealed cavity 116 and a second hermetically sealed cavity 118, initially be held at the first ambient pressure $P_1$. During the bonding process, the outgassing element 110 releases a second gas 310 under the relative high temperature condition, to increase a pressure within the second hermetically sealed cavity 118 to a greater pressure $P_2$. In some embodiments, an additional thermal process may be performed to further facilitate the outgas sing process of the outgas sing element 110 and increase the pressure within the second hermetically sealed cavity 118. Therefore, the outgassing element 110 enables the pressure of the second hermetically sealed cavity 118 to be tuned during and/or after the bonding process (and without additional processing steps and/or structural damage to the MEMS structure 104 and/or the CMOS substrate 102).

Figure 11:
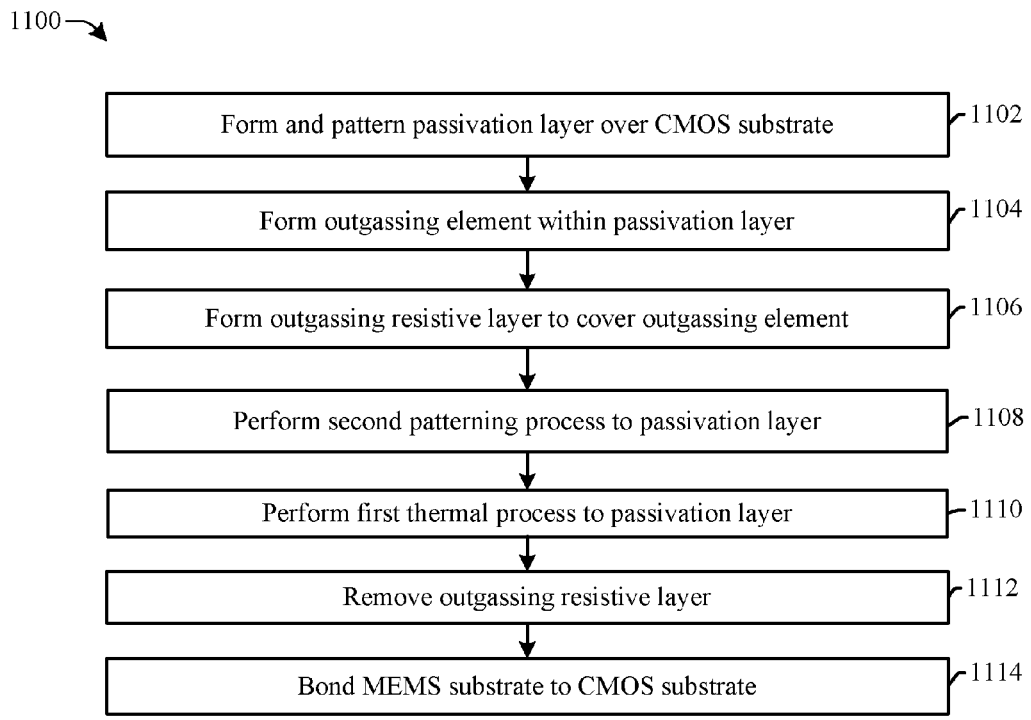
FIG. 11 illustrates a flow diagram of some embodiments of a method of forming a MEMS package having an outgassing element configured to adjust a pressure of a hermetically sealed cavity.

FIG. 11 illustrates some embodiments of a method 1100 of forming a micro-electromechanical system (MEMS) package having an outgassing element configured to adjust a pressure of a hermetically sealed cavity.

Although method 1100 is described in relation to FIGS. 3-10, it will be appreciated that the method 1100 is not limited to such structures disclosed in FIGS. 3-10, but instead may stand alone independent of the structures disclosed in FIGS. 3-10. Similarly, it will be appreciated that the structures disclosed in FIGS. 3-10 are not limited to the method 1100, but instead may stand alone as structures independent of the method 1100. Also, while disclosed methods (e.g., method 1100) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1102, a passivation layer is formed and patterned over a CMOS substrate. A plurality of semiconductor devices and a plurality of metal interconnect layers within a dielectric structure having a plurality of ILD layers can be formed within the CMOS substrate prior to forming the passivation layer. A hard mask layer may be formed and patterned over the passivation layer. FIG. 3 illustrates some embodiments of a cross-sectional view 300 corresponding to act 1102.

At 1104, an outgassing element is formed within a trench within the passivation layer. In some embodiments, the outgassing element is formed and patterned at a location corresponding to a MEMS device that prefers an operation pressure greater than other MEMS devices to be formed. The outgassing element can be a dielectric layer configured to release a gas into a cavity of the MEMS device. The outgassing element may be formed by a plasma enhanced deposition process. In some embodiments, the outgassing element is patterned to have an upper surface coplanar with the hard mask layer. FIG. 4 illustrates some embodiments of a cross-sectional view 400 corresponding to act 1104.

At 1106, an outgassing resistive layer is formed over the outgassing element and the passivation layer, to provide a protection for the outgassing element from early outgassing. FIG. 5 illustrates some embodiments of a cross-sectional view 500 corresponding to act 1106.

At 1108, a second patterning process is performed to the passivation layer and the hard mask layer. In some embodiments, second patterning process forms a plurality of bonding trenches through the passivation layer. The bonding trenches may expose a top metal layer of the plurality of interconnect layers. FIG. 6 illustrates some embodiments of a cross-sectional view 600 corresponding to act 1108.

At 1110, a first thermal process is performed to the passivation layer. For example, the first thermal process may be used to form and/or prepare a first bonding pad. The first bonding pad may be the top metal layer of the interconnect layers, which can be cleaned for a subsequent bonding process. The first bonding pad may also be a metal or semiconductor layer formed on the passivation layer or the ILD layer. The outgassing resistive layer protects the outgassing element from outgassing during the first thermal process. FIG. 7 illustrates some embodiments of a cross-sectional view 700 corresponding to act 1110.

At 1112, the outgassing resistive layer is removed to expose the outgassing element. FIG. 8 illustrates some embodiments of a cross-sectional view 800 corresponding to act 1112.

At 1114, the MEMS substrate is bonded to the CMOS substrate at a first pressure to form one or more hermetically sealed cavities arranged therebetween. The MEMS substrate may be bonded to the CMOS substrate using a second thermal process. The second thermal process causes the exposed outgassing element to release a gas during the bonding process to tune at least one of the cavities to achieve a second pressure greater than the first pressure. FIGS. 9-10 illustrates some embodiments of a cross-sectional view 900-1000 corresponding to act 1114.

Therefore, the present disclosure relates to micro-electromechanical system (MEMS) package that comprises an outgassing element configured to adjust a pressure within a hermetically sealed cavity by inducing an outgassing process during and/or after a bonding process, and an associated method.

In some embodiments, the present disclosure relates to a method of forming a MEMS substrate. The method comprises forming an outgassing element within a passivation layer over a CMOS substrate and forming an outgassing resistive layer to cover the outgassing element. The method further comprises removing the outgassing resistive layer from over the outgassing element. The method further comprises bonding a MEMS substrate to the front side of the CMOS substrate to enclose a first MEMS device within a first cavity and a second MEMS device within a second cavity. After removing the outgassing resistive layer, the outgassing element releases a gas into the second cavity to increase a second pressure of the second cavity to be greater than a first pressure of the first cavity.

In other embodiments, the present disclosure relates to a method of forming a MEMS substrate. The method comprises forming an outgassing element at a front side of a CMOS substrate. The method further comprises forming an outgassing resistive layer to cover the outgassing element. The method further comprises performing a thermal process to the CMOS substrate and removing the outgassing resistive layer. The method further comprises bonding a MEMS substrate to the CMOS substrate to enclose a first MEMS device within a first hermetically sealed cavity having a first pressure and a second MEMS device within a second hermetically sealed cavity having a second pressure. After removing the outgassing resistive layer, the outgassing element releases a gas into the second cavity to increase the second pressure of the second cavity.

In yet other embodiments, the present disclosure relates to a micro-electromechanical system (MEMS) package. The MEMS package comprises a CMOS substrate comprising a passivation layer disposed over a semiconductor substrate. The MEMS package further comprises a MEMS substrate bonded to the CMOS substrate and enclosing a first MEMS device hermetically sealed within a first cavity having a first pressure and a second MEMS device hermetically sealed within a second cavity having a second pressure. An outgassing element is disposed within the passivation layer and is exposed to the second cavity. The outgassing element is configured to release a gas into the second cavity to increase the second pressure of the second cavity, during or after a bonding process between the CMOS substrate and the MEMS substrate. The second pressure of the second cavity is greater than the first pressure of the first cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a micro-electromechanical systems (MEMS) package, the method comprising:
    forming an outgassing element within a passivation layer over a CMOS substrate;
    forming an outgassing resistive layer to cover the outgassing element;
    removing the outgassing resistive layer from over the outgassing element; and
    bonding a MEMS substrate to a front side of the CMOS substrate to enclose a first MEMS device within a first cavity and a second MEMS device within a second cavity, wherein after removing the outgassing resistive layer, the outgassing element releases a gas into the second cavity during or after the bonding to increase a second pressure of the second cavity to be greater than a first pressure of the first cavity.

2. The method of claim 1, wherein outgassing resistive layer comprises silicon nitride.

3. The method of claim 1, wherein the outgassing element is formed by depositing and patterning a high density plasma oxide layer within a trench of the passivation layer, wherein the outgassing element is formed to have an upper surface aligned with that of a hard mask overlying the passivation layer.

4. The method of claim 1, further comprising:
    forming a plurality of semiconductor devices within a substrate;
    forming a plurality of metal interconnect layers including metal wire layers and vias within a dielectric structure comprising a plurality of inter-level dielectric layers over the substrate; and
    forming the passivation layer over the plurality of metal interconnect layers and the inter-level dielectric layer.

5. The method of claim 4, further comprising:
    performing a second patterning process to the passivation layer and the outgassing resistive layer to form a plurality of bonding trenches through the outgassing resistive layer and the passivation layer, while the outgassing element is protected by the outgassing resistive layer;
    wherein the plurality of bonding trenches are formed to expose a top metal layer of the plurality of metal interconnect layers, which is used as a first bonding metal layer for bonding the MEMS substrate and the CMOS substrate.

6. The method of claim 5, wherein a second bonding metal layer is formed on a protrusion extending outward from the MEMS substrate prior to removing the outgassing resistive layer.

7. A method for manufacturing a micro-electromechanical systems (MEMS) package, the method comprising:
    forming an outgassing element at a front side of a CMOS substrate;
    forming an outgassing resistive layer to cover the outgassing element;
    performing a thermal process to the CMOS substrate;
    removing the outgassing resistive layer;
    bonding a MEMS substrate to the CMOS substrate to enclose a first MEMS device within a first hermetically sealed cavity having a first pressure and a second MEMS device within a second hermetically sealed cavity having a second pressure; and wherein after removing the outgassing resistive layer, the outgassing element releases a gas into the second cavity during or after the bonding to increase the second pressure of the second cavity.

8. The method of claim 7, wherein the outgassing resistive layer comprises silicon nitride.

9. The method of claim 7, wherein the outgassing element is formed by depositing and patterning a high density plasma oxide layer.

10. The method of claim 7, wherein the CMOS substrate is formed and patterned by a process comprising:
   forming a plurality of semiconductor devices within a semiconductor substrate;
   forming a plurality of metal interconnect layers including metal wire layers and vias within a dielectric structure comprising a plurality of inter-level dielectric layers over the semiconductor substrate;
   forming a passivation layer over the inter-level dielectric layer;
   performing a first patterning process to the passivation layer to form a trench within an upper surface of the passivation layer, wherein the trench comprises the outgassing element in the trench;
   forming the outgassing resistive layer to cover the outgassing element;
   performing the second patterning process to the passivation layer;
   performing the thermal process to releases a second gas from the passivation layer; and
   removing the outgassing resistive layer.

11. The method of claim 10, wherein the passivation layer is patterned by the first patterning process using a hard mask layer, wherein the outgassing element is formed to have an upper surface aligned with an upper surface of the hard mask layer.

12. The method of claim 10, wherein the second patterning process comprises patterning the passivation layer and the outgassing resistive layer to form a plurality of bonding trenches through the outgassing resistive layer and the passivation layer, while the outgassing element is protected by the outgassing resistive layer.

13. The method of claim 12, wherein the plurality of bonding trenches are formed to expose a top metal layer of the plurality of metal interconnect layers, which is used as a first bonding metal layer for bonding the MEMS substrate and the CMOS substrate.

14. The method of claim 7, wherein the MEMS substrate is formed by a process comprising:
   forming a first recess and a second recess from a front side of a capping substrate,
   bonding a MEMS layer to the front side of the capping substrate; and
patterning the MEMS layer to form the first MEMS device and the second MEMS device;
   wherein the first recess is located at a first position in communication with the first MEMS device and configured as a part of the first cavity, and the second recess is located at a second position in communication with the second MEMS device and configured as a part of the second cavity.

15. A method for manufacturing a micro-electromechanical systems (MEMS) package, the method comprising:
   forming a passivation layer over a semiconductor substrate to form a CMOS substrate;
   forming an outgassing element within the passivation layer;
   bonding a MEMS substrate to the CMOS substrate and enclosing a first MEMS device hermetically sealed within a first cavity having a first pressure and a second MEMS device hermetically sealed within a second cavity having a second pressure; and
   wherein the outgassing element is exposed to the second cavity, and is configured to release a gas into the second cavity to increase the second pressure of the second cavity to be greater than the first pressure of the first cavity during or after bonding the MEMS substrate to the CMOS substrate;
   wherein the outgassing element is formed by patterning to form a trench into the passivation layer using a hard mask layer, depositing an outgassing layer within the trench and over the passivation layer, and removing the outgassing layer from an upper surface of the hard mask layer to form the outgassing element coplanar with the hard mask layer.

16. The method of claim 15, wherein the outgassing element is formed using a high density plasma oxide.

17. The method of claim 15,
   wherein the CMOS substrate and the MEMS substrate are bonded through a top metal layer of the CMOS substrate and a conductive bonding pad of the MEMS substrate;
   wherein the top metal layer is formed between the passivation layer and the semiconductor substrate.

18. The method of claim 17, wherein:
   wherein the MEMS substrate and the conductive bonding pad are formed to extend through the passivation layer to contact the top metal layer at a bonding interface.

19. The method of claim 15, further comprising:
   forming a first recess and a second recess from a front side of a capping substrate; and
   bonding the MEMS substrate to the front side of the capping substrate; and
   wherein a dielectric liner is formed between the capping substrate and the MEMS substrate and lining surfaces of the first and second recesses.

20. The method of claim 15, prior to the bonding, further comprising:
   forming an outgassing resistive layer to cover the outgassing element;
   forming bonding trenches through the passivation layer; and
   removing the outgassing resistive layer.

* * * * *